United States Patent
Pyo et al.

(10) Patent No.: US 11,723,160 B2
(45) Date of Patent: Aug. 8, 2023

(54) DISPLAY DEVICE

(71) Applicant: LG ELECTRONICS INC., Seoul (KR)

(72) Inventors: Jonggil Pyo, Seoul (KR); Seunggyu Kang, Seoul (KR); Jaeyong Kim, Seoul (KR); Kwaneun Jin, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 17/283,514

(22) PCT Filed: Jul. 29, 2019

(86) PCT No.: PCT/KR2019/009391
§ 371 (c)(1),
(2) Date: Apr. 7, 2021

(87) PCT Pub. No.: WO2020/196997
PCT Pub. Date: Oct. 1, 2020

(65) Prior Publication Data
US 2021/0392765 A1    Dec. 16, 2021

(30) Foreign Application Priority Data

Mar. 28, 2019  (KR) ......................... 10-2019-0035917

(51) Int. Cl.
*H05K 5/02* (2006.01)
*H05K 5/00* (2006.01)

(52) U.S. Cl.
CPC ......... *H05K 5/0217* (2013.01); *H05K 5/0017* (2013.01)

(58) Field of Classification Search
USPC ........ 361/807, 809, 810, 728, 752, 796, 800
See application file for complete search history.

(56) References Cited

U.S. PATENT DOCUMENTS

| 6,831,829 B2 | 12/2004 | Einhorn et al. |
| 2007/0159035 A1* | 7/2007 | Mullen ............... A47B 46/005 312/245 |
| 2011/0304781 A1 | 12/2011 | Rowell |
| 2018/0070467 A1* | 3/2018 | Kim ..................... H05K 5/0247 |
| 2020/0035133 A1* | 1/2020 | Pyo .................... F16M 11/2014 |

(Continued)

FOREIGN PATENT DOCUMENTS

| CN | 109219843 | 1/2019 |
| KR | 10-0495216 | 6/2005 |

(Continued)

OTHER PUBLICATIONS

PCT International Application No. PCT/KR2019/009391, International Search Report dated Dec. 27, 2019, 4 pages.

(Continued)

*Primary Examiner* — Hung S. Bui
(74) *Attorney, Agent, or Firm* — Lee Hong Degerman Kang & Waimey

(57) ABSTRACT

A display device is disclosed. The display device includes a display panel; a module cover disposed behind the display panel and coupled to the display panel; a frame disposed behind the module cover and coupled to the module cover; and a front cover configured to close or open the display panel while moving on the frame in an up-down direction.

12 Claims, 14 Drawing Sheets

(56) References Cited

U.S. PATENT DOCUMENTS

2021/0337684 A1\* 10/2021 Pyo ...................... H05K 5/0217
2022/0039275 A1\*  2/2022 Kang ................... H05K 5/0017

FOREIGN PATENT DOCUMENTS

| KR | 20100123009 |   | 11/2010 |              |
|----|-------------|---|---------|--------------|
| KR | 20150031525 | * |  3/2015 | ... G09F 9/00 |
| KR | 20180027318 |   |  3/2018 |              |

OTHER PUBLICATIONS

European Patent Office Application Serial No. 19920767.1, Search Report dated Nov. 10, 2022, 9 pages.

\* cited by examiner

[FIG. 1]
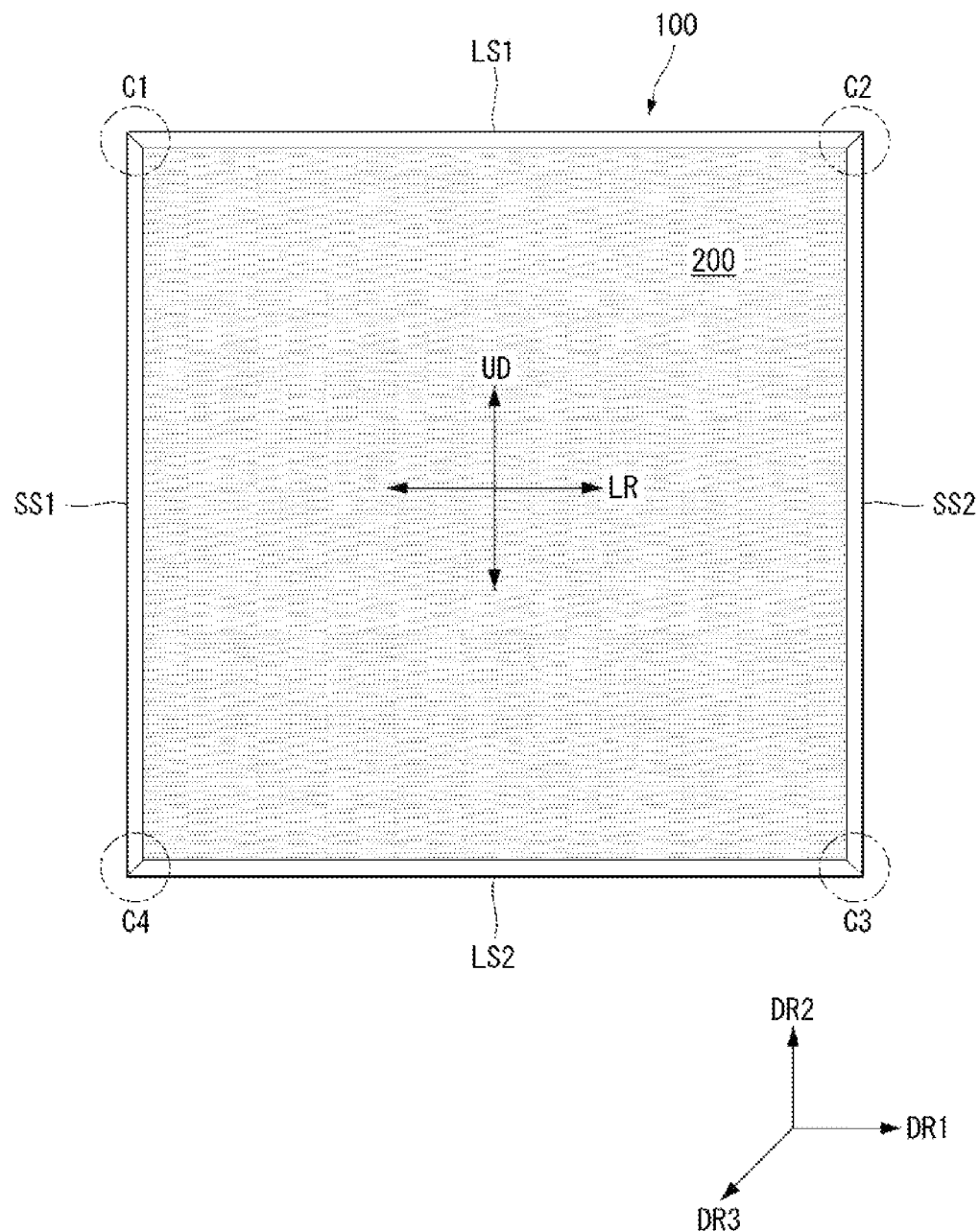

[FIG. 2]
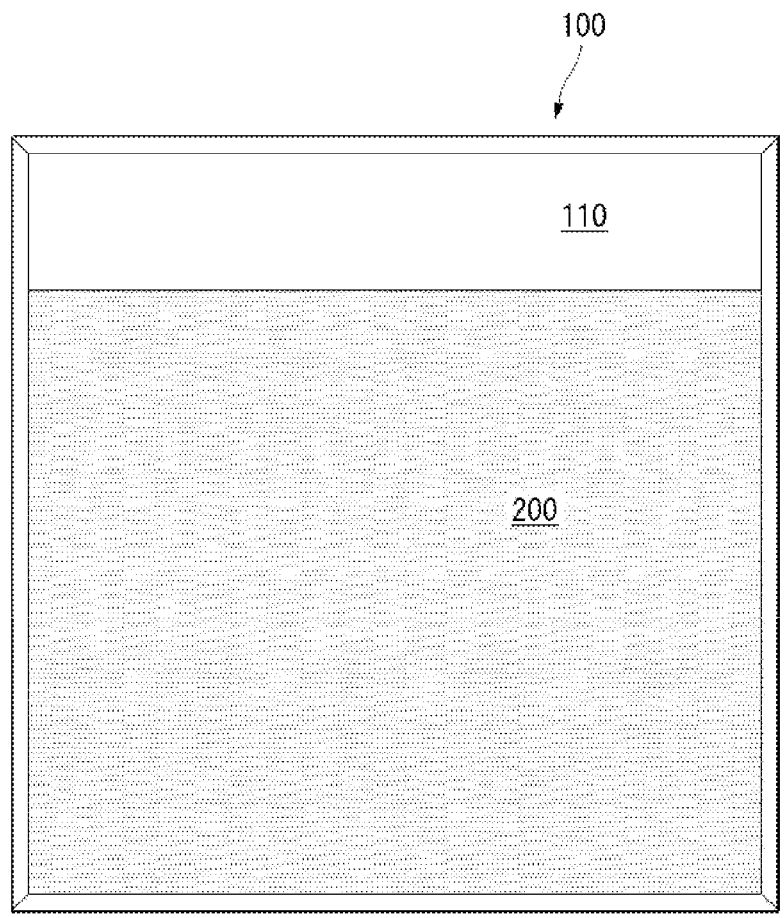

[FIG. 3]
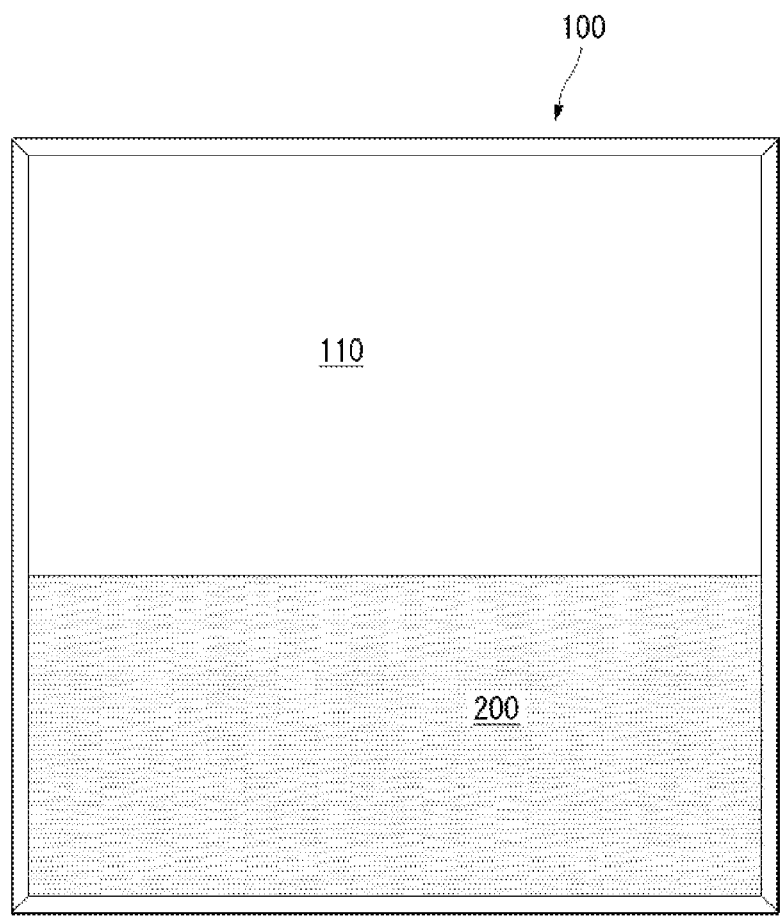

[FIG. 4]
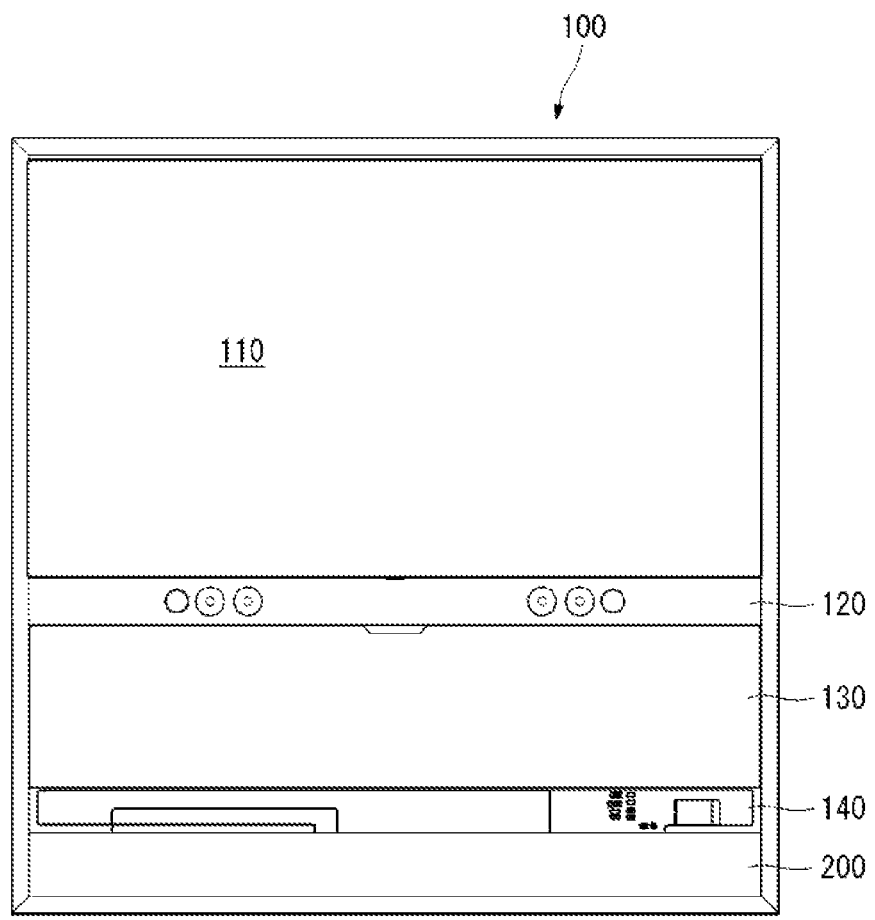

[FIG. 5]
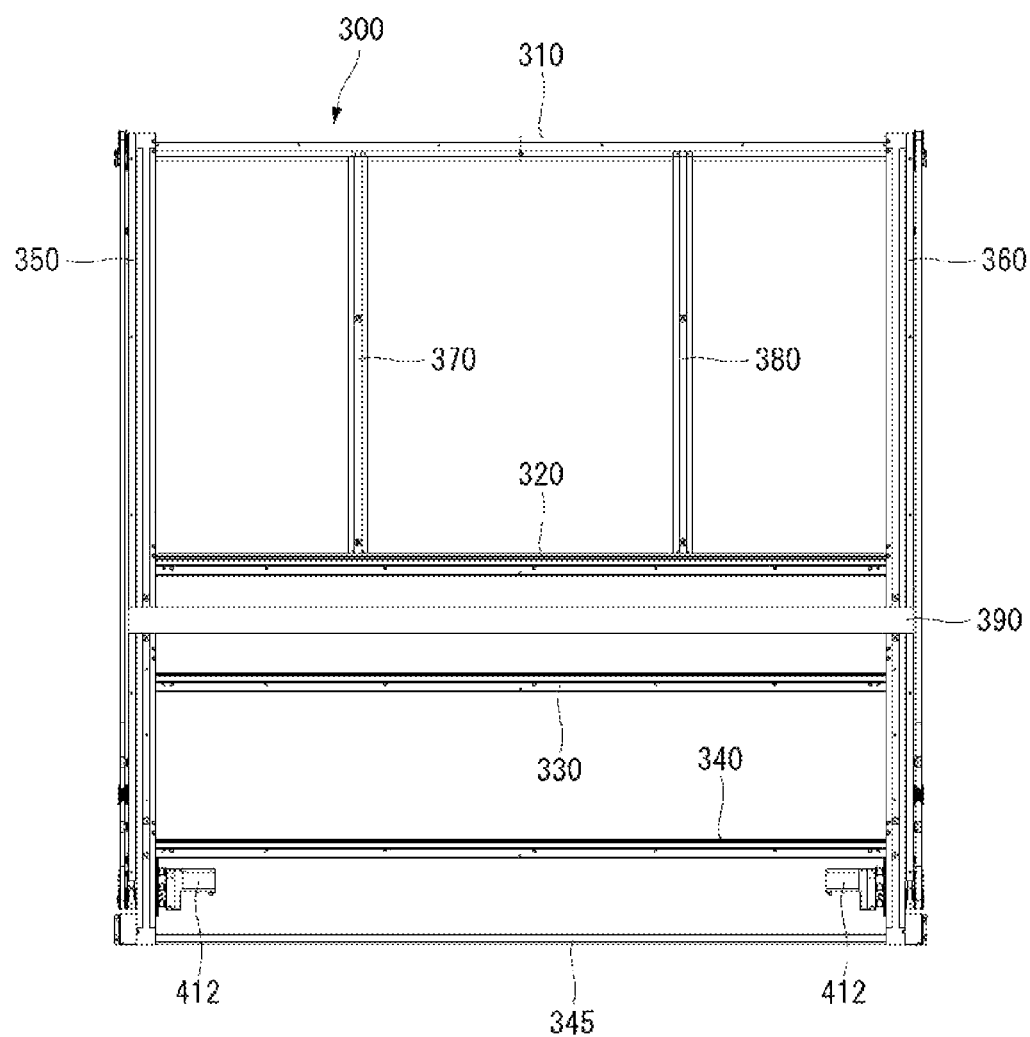

[FIG. 6]
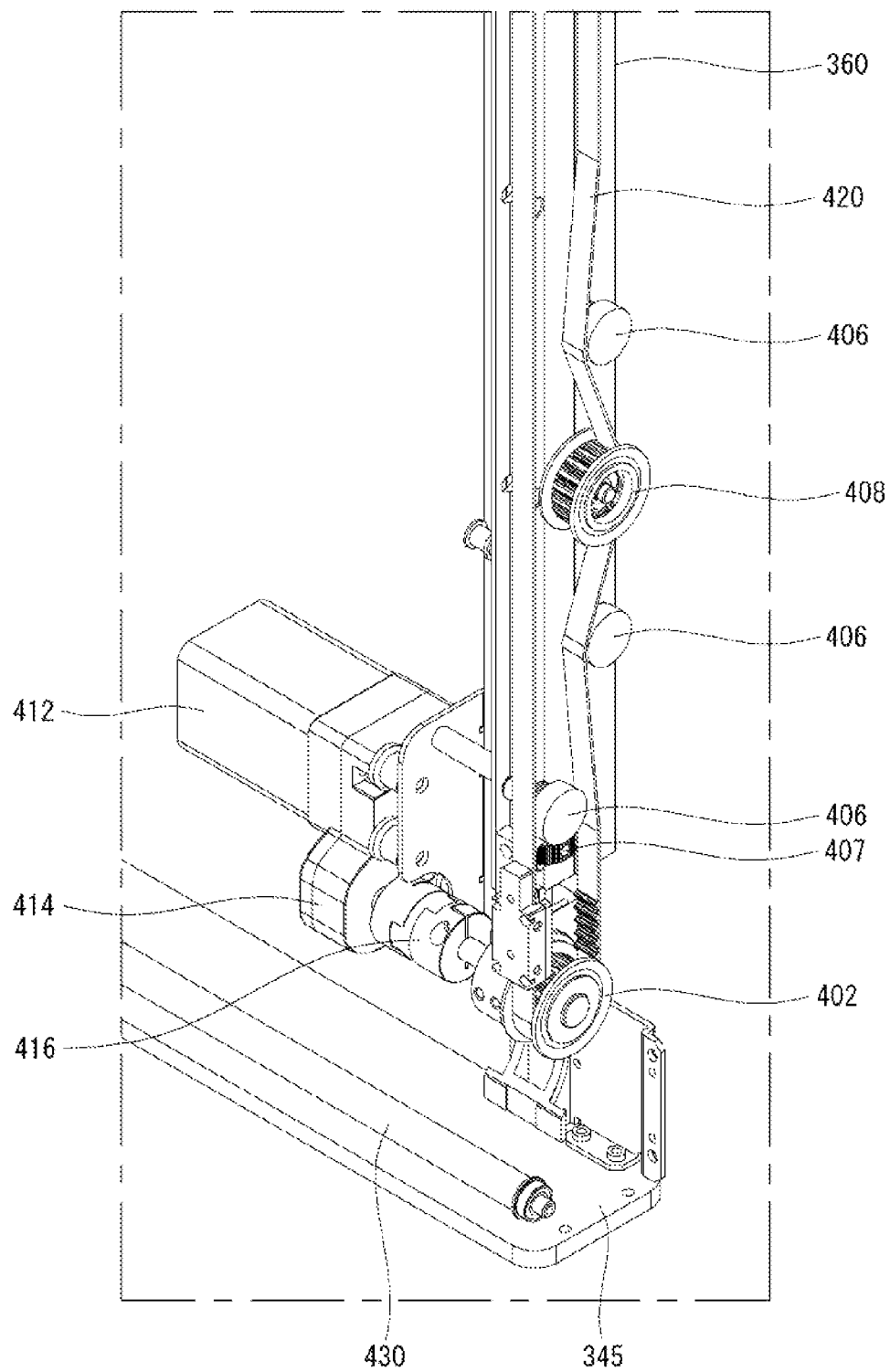

[FIG. 7]
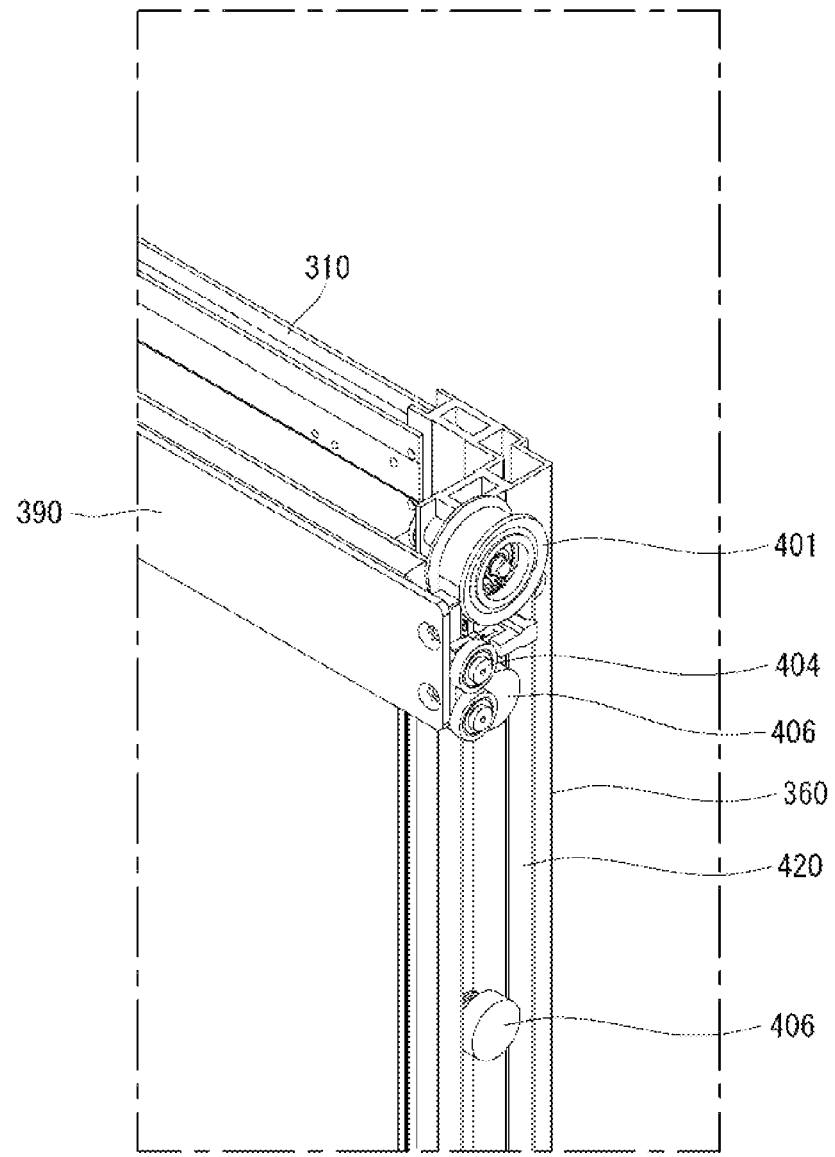

【FIG. 8】
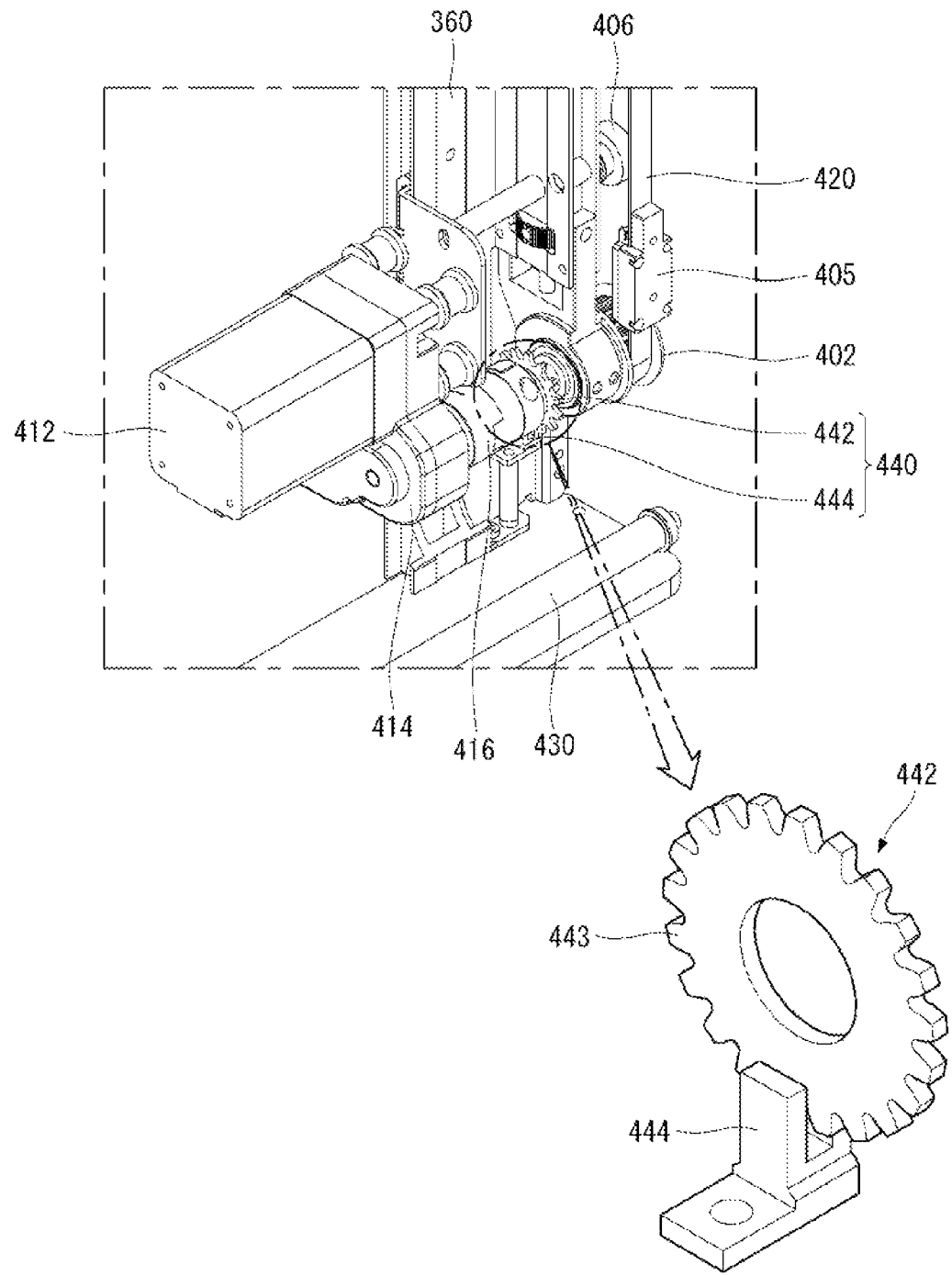

[FIG. 9]
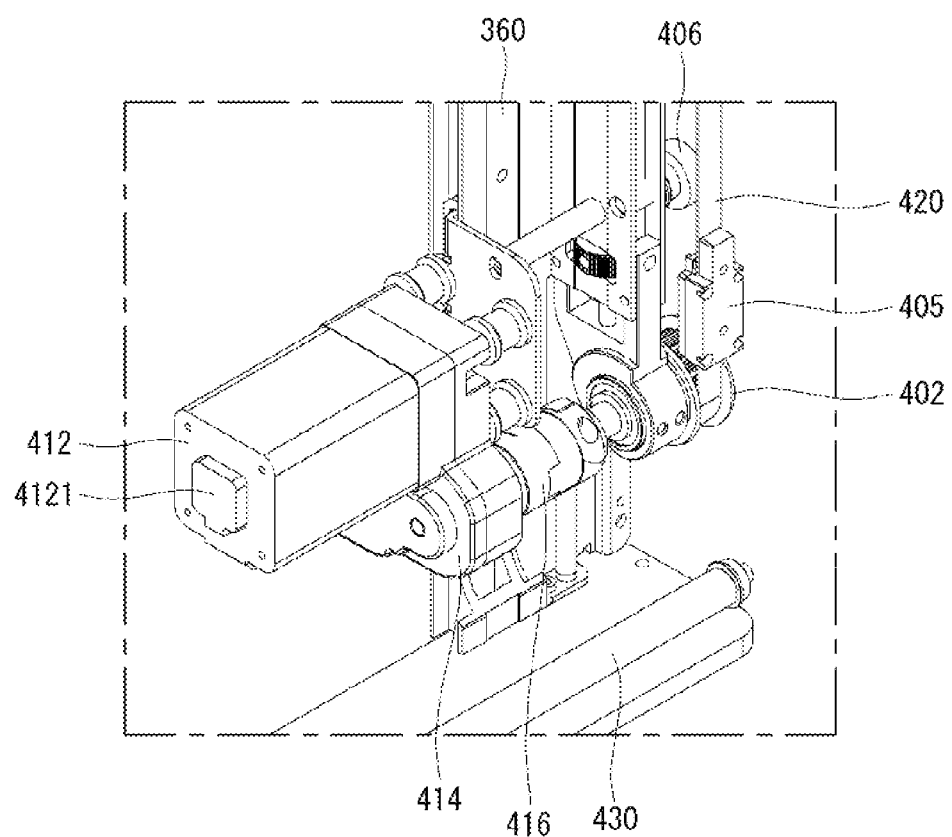

[FIG. 10]
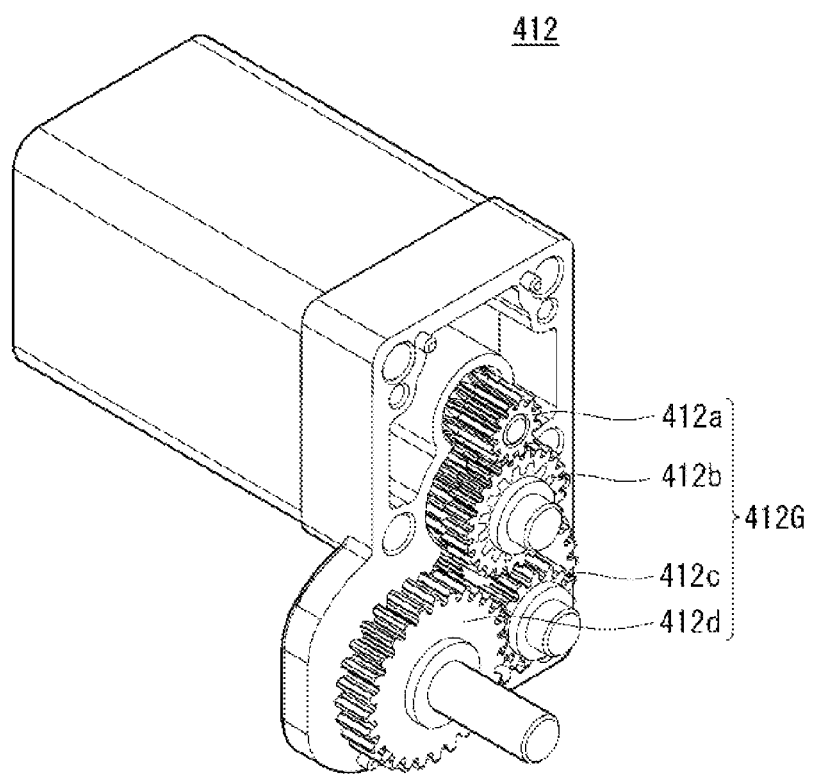

[FIG. 11]
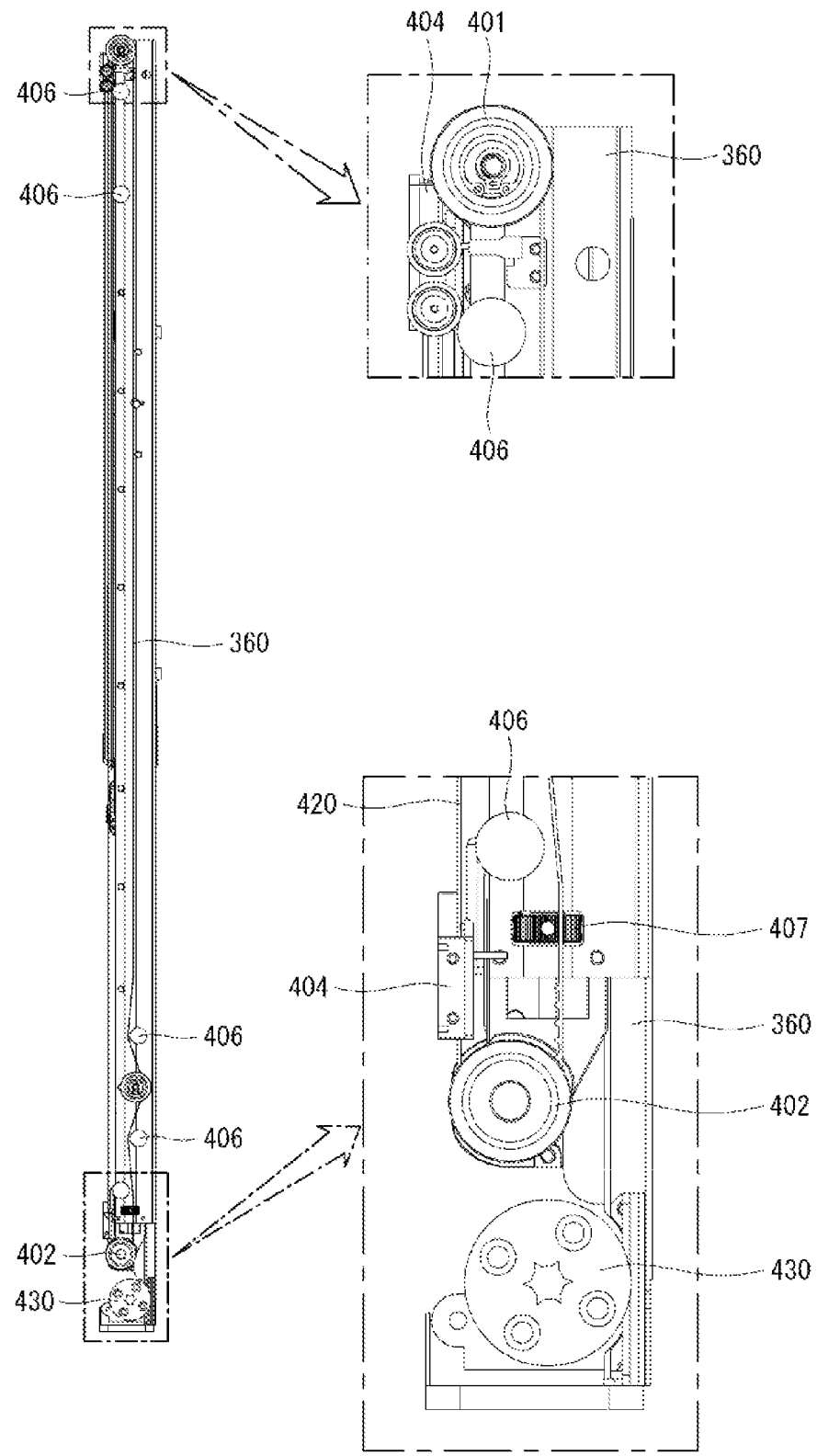

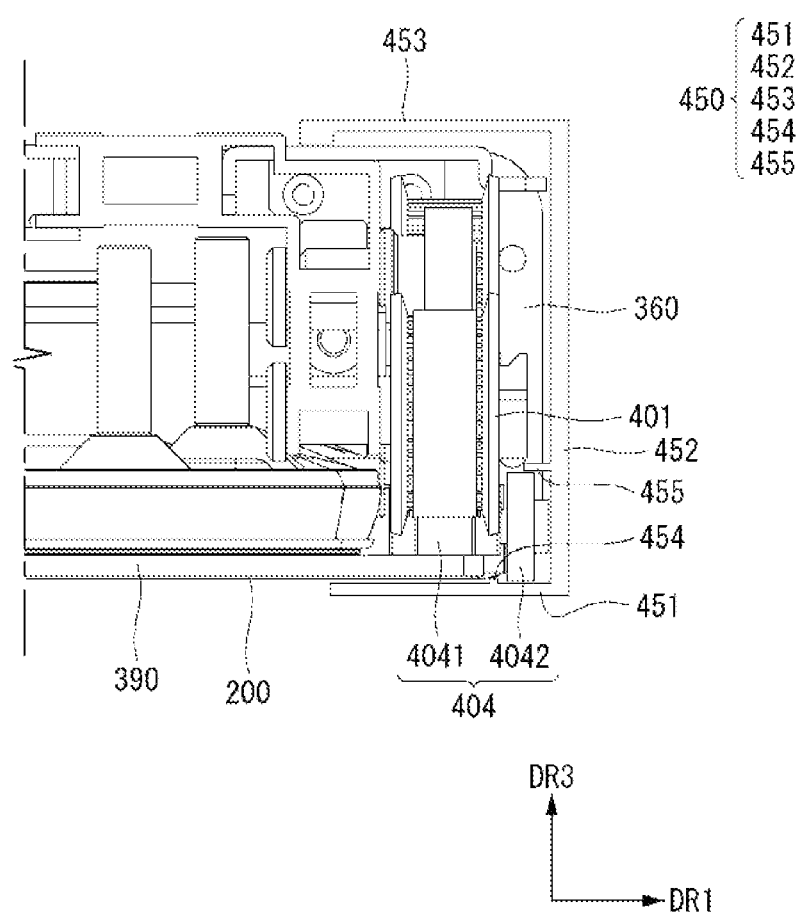
[FIG. 12]

[FIG. 13]
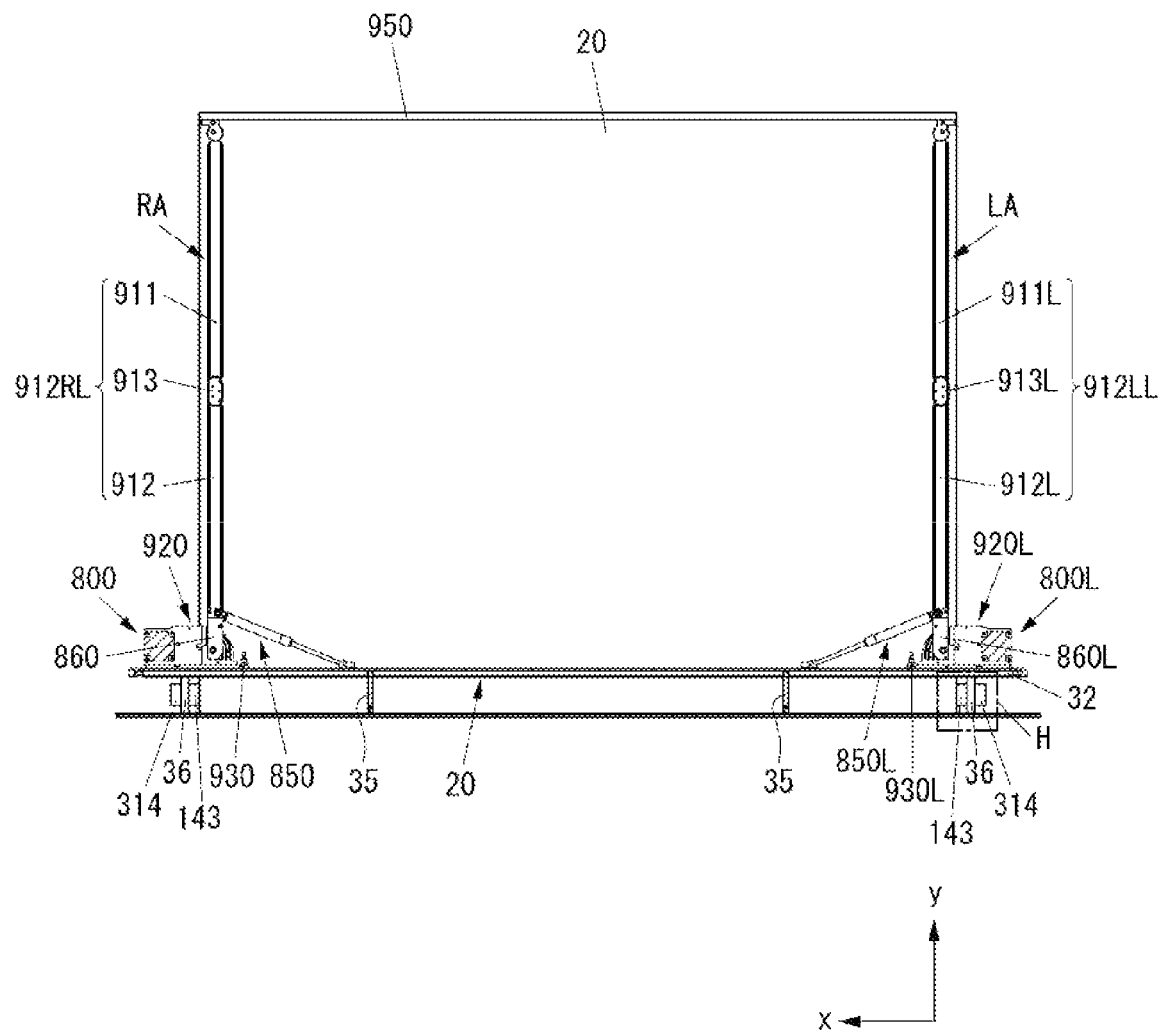

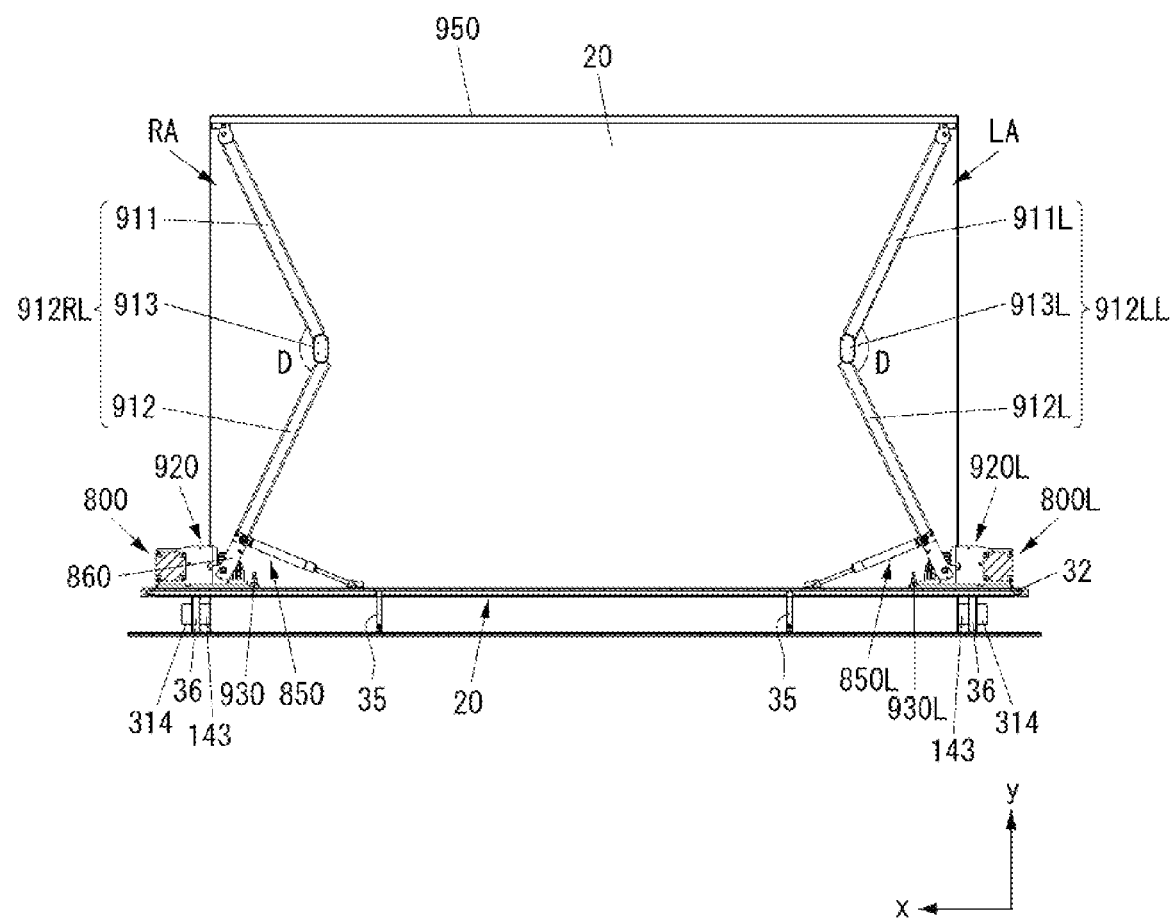
[FIG. 14]

DISPLAY DEVICE

CROSS-REFERENCE TO RELATED APPLICATIONS

This application is the National Stage filing under 35 U.S.C. 371 of International Application No. PCT/KR2019/009391, filed on Jul. 29, 2019, which claims the benefit of earlier filing date and right of priority to Korean Application No. 10-2019-0035917 filed on Mar. 28, 2019, the contents of which is incorporated by reference herein in its entirety.

TECHNICAL FIELD

The present disclosure relates to a display device. More specifically, the present disclosure relates to a hidden structure of a display device.

BACKGROUND ART

With the development of the information society, various types of demands for display devices are increasing. Various display devices such as a liquid crystal display (LCD), a plasma display panel (PDP), an electroluminescent display (ELD), and a vacuum fluorescent display (VFD) have been recently studied and used in response to the various types of demands.

A liquid crystal display panel of the LCD includes a liquid crystal layer and a thin film transistor (TFT) substrate and a color filter substrate that are disposed opposite each other with the liquid crystal layer interposed therebetween. The liquid crystal display panel can display an image using light provided by a backlight unit.

An OLED panel can display an image by depositing an organic layer, that can emit light by itself, on a substrate at which transparent electrodes are formed. The OLED panel may be thin and have flexible characteristics.

Many studies have been made on structural characteristics of display devices including various panels as described above.

DISCLOSURE

Technical Problem

An object of the present disclosure is to address the above-described and other problems. Another object of the present disclosure is to provide a protective structure of a display panel.

Another object of the present disclosure is to provide a storage structure of a display device.

Technical Solution

To achieve the above-described and other objects, in one aspect of the present disclosure, there is provided a display device comprising a display panel; a module cover disposed behind the display panel and coupled to the display panel; a frame disposed behind the module cover and coupled to the module cover; and a front cover configured to close or open the display panel while moving on the frame in an up-down direction.

According to another aspect of the present disclosure, the display device may further comprise a bar extending in a left-right direction of the display panel and sliding on the frame; and a roller disposed adjacent to a lower end of the frame and configured to roll or unroll the front cover, wherein an upper end of the front cover may be fixed to the bar.

According to another aspect of the present disclosure, the frame may include a plurality of horizontal frames extending in the left-right direction of the display panel; a vertical frame intersecting and coupled to the plurality of horizontal frames, the vertical frame being disposed adjacent to one side of the display panel; and a guide roller sliding and moving on the vertical frame, the guide roller being fixed to the bar.

According to another aspect of the present disclosure, the display device may further comprise a lower pulley installed at the vertical frame adjacent to the roller; an upper pulley installed adjacent to an upper end of the vertical frame; and a belt configured to connect the lower pulley and the upper pulley, wherein the guide roller may be fixed to the belt.

According to another aspect of the present disclosure, the display device may further comprise a tension roller installed at the vertical frame between the upper pulley and the lower pulley, wherein the tension roller may be configured to pull or push the belt.

According to another aspect of the present disclosure, the display device may further comprise a motor mounted on the vertical frame and configured to provide a rotational force to the lower pulley.

According to another aspect of the present disclosure, the display device may further comprise a joint disposed between the motor and the lower pulley, wherein the joint may be configured to transfer the rotational force provided by the motor to the lower pulley.

According to another aspect of the present disclosure, the motor may include a first gear fixed to a rotating shaft of the motor; a second gear engaged with the first gear; a third gear engaged with the second gear; and a fourth gear engaged with the third gear, wherein a gear reduction ratio of the first to fourth gears may be 6 to 8.

According to another aspect of the present disclosure, the display device may further comprise a rotator disposed between the motor and the lower pulley and including a plurality of protrusions, the rotator configured to rotate together with the lower pulley; and a sensor disposed adjacent to the plurality of protrusions of the rotator and configured to detect a rotation of the rotator.

According to another aspect of the present disclosure, the motor may further include an encoder configured to detect a rotation of the rotator.

According to another aspect of the present disclosure, the display device may further comprise a side cover disposed adjacent to the vertical frame, wherein the side cover may include a first part covering a portion of the bar; a second part bending and extending from the first part and covering the belt; a third part bending and extending from the second part, the third part being opposite to the first part with respect to the vertical frame; and guide ribs protruding from the first part or the second part toward a side frame and configured to guide the guide roller.

According to another aspect of the present disclosure, the display device may further comprise a foldable link connected to the bar and configured to move the bar in the up-down direction.

According to another aspect of the present disclosure, the foldable link may include an upper link pivotally connected to the bar; a lower link pivotally connected to the upper link; and a motor configured to raise the lower link.

According to another aspect of the present disclosure, the display device may further comprise a gas spring connected to the lower link and configured to push the lower link.

According to another aspect of the present disclosure, the foldable link may include a plurality of foldable links, wherein the plurality of foldable links may be disposed on left and right sides of the front cover, respectively.

Advantageous Effects

According to at least one aspect of the present disclosure, the present disclosure can provide a protective structure of a display panel.

According to at least one aspect of the present disclosure, the present disclosure can provide a storage structure of a display device.

Further scope of applicability of the present disclosure will become apparent from the detailed description given blow. However, it should be understood that the detailed description and specific examples, while indicating embodiments of the disclosure, are given by illustration only, since various changes and modifications within the spirit and scope of the present disclosure will become apparent to those skilled in the art from this detailed description.

DESCRIPTION OF DRAWINGS

FIGS. 1 to 14 illustrate examples of a display device according to embodiments of the disclosure.

MODE FOR INVENTION

Reference will now be made in detail to embodiments of the disclosure, examples of which are illustrated in the accompanying drawings. Wherever possible, the same reference numbers will be used throughout the drawings to refer to the same or like parts.

In general, a suffix such as "module" and "unit" may be used to refer to elements or components. Use of such a suffix herein is merely intended to facilitate description of the present disclosure, and the suffix itself is not intended to give any special meaning or function. It will be noted that a detailed description of known arts will be omitted if it is determined that the detailed description of the known arts can obscure the embodiments of the disclosure. The accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

The terms including an ordinal number such as first, second, etc. may be used to describe various components, but the components are not limited by such terms. The terms are used only for the purpose of distinguishing one component from other components.

When any component is described as "connected to" or "coupled to" another component, this should be understood to mean that still other component(s) may exist between them, although any component may be directly connected to or directly coupled to another component. In contrast, when any component is described as "directly connected to" or "directly coupled to" another component, this should be understood to mean that no component exists between them.

A singular expression can include a plural expression as long as it does not have an apparently different meaning in context.

In the present disclosure, the terms "include" or "have" should be understood to be intended to designate that illustrated features, numbers, steps, operations, components, parts or combinations thereof are present and not to preclude the existence of one or more different features, numbers, steps, operations, components, parts or combinations thereof, or the possibility of the addition thereof.

Referring to FIG. 1, a display device may include a first long side LS1, a second long side LS2 opposite the first long side LS1, a first short side SS1 adjacent to the first long side LS1 and the second long side LS2, and a second short side SS2 opposite the first short side SS1.

Herein, the first short side SS1 may be referred to as a first side area; the second short side SS2 may be referred to as a second side area opposite the first side area; the first long side LS1 may be referred to as a third side area which is adjacent to the first side area and the second side area and is disposed between the first side area and the second side area; and the second long side LS2 may be referred to as a fourth side area which is adjacent to the first side area and the second side area, is disposed between the first side area and the second side area, and is opposite to the third side area.

Embodiments of the disclosure illustrate and describe that lengths of the first and second long sides LS1 and LS2 are longer than lengths of the first and second short sides SS1 and SS2 for convenience of explanation. However, the lengths of the first and second long sides LS1 and LS2 may be almost equal to the lengths of the first and second short sides SS1 and SS2.

In the following description, a first direction DR1 may be a direction parallel to the long sides LS1 and LS2 of the display device, and a second direction DR2 may be a direction parallel to the short sides SS1 and SS2 of the display device. Further, a third direction DR3 may be a direction perpendicular to the first direction DR1 and/or the second direction DR2.

The first direction DR1 and the second direction DR2 may be commonly referred to as a horizontal direction. Further, the third direction DR3 may be referred to as a vertical direction.

The first long side LS1 may be referred to as an upper side or an upper surface. The second long side LS2 may be referred to as a lower side or a lower surface. The first short side SS1 may be referred to as a right side or a right surface, and the second short side SS2 may be referred to as a left side or a left surface.

Further, the first long side LS1, the second long side LS2, the first short side SS1, and the second short side SS2 may be referred to as edges of the display device. Positions where the first long side LS1, the second long side LS2, the first short side SS1, and the second short side SS2 meet one another may be referred to as corners. For example, a position where the first long side LS1 and the first short side SS1 meet each other may be referred to as a first corner C1; a position where the first long side LS1 and the second short side SS2 meet each other may be referred to as a second corner C2; a position where the second short side SS2 and the second long side LS2 meet each other may be referred to as a third corner C3; and a position where the second long side LS2 and the first short side SS1 meet each other may be referred to as a fourth corner C4.

In embodiments disclosed herein, a direction from the first short side SS1 to the second short side SS2 or a direction from the second short side SS2 to the first short side SS1 may be referred to as a left-right direction LR. A direction from the first long side LS1 to the second long side LS2 or from the second long side LS2 to the first long side LS1 may be referred to as an up-down direction UD.

A front surface of a display device 100 may be covered. For example, a fabric front cover 200 may cover the front surface of the display device 100. Hence, image information provided by the display device 100 may be hidden. For another example, the front cover 200 may be a material containing metal. For another example, the front cover 200 may be a composite of a metal and a fabric material.

Referring to FIG. 2, the front cover 200 may open a part of the display device 100. A part of the display device 100 may be a part of a display panel 110. The front cover 200 may go down. Hence, a portion of an upper part of the display panel 110 may be open to the outside. In this instance, an aspect ratio may be 48:9. For example, audio channels may be displayed on a portion of an upper surface of the display panel 110.

Referring to FIG. 3, the front cover 200 may open a front surface of the display panel 110 of the display device 100. The front cover 200 may go down. Hence, the front surface of the display panel 110 may be open to the outside. In this instance, an aspect ratio may be 16:9. For example, an image may be displayed on the front surface of the display panel 110.

Referring to FIG. 4, the front cover 200 may open the front surface of the display device 100. The front cover 200 may go down adjacent to the lower side of the display device 100. Hence, a speaker module 120, a set-top box module 130, and a connector module 140 as well as the display panel 110 may be open to the outside of the display device 100.

Referring to FIGS. 5 and 11, a frame 300 may form a skeleton of the display device 100 (see FIG. 4). The frame 300 may include horizontal frames 310, 320, 330 and 340 and vertical frames 350, 360, 370 and 380. A plurality of horizontal frames 310, 320, 330, 340 and 345 may be provided. The plurality of vertical frames 350, 360, 370 and 380 may be provided. The frames 300 may be coupled to each other.

The first horizontal frame 310 may be disposed at the upper side of the display device. The second horizontal frame 320 may be parallel to the first horizontal frame 310 and may be disposed below the first horizontal frame 310. The third horizontal frame 330 may be parallel to the second horizontal frame 320 and may be disposed below the second horizontal frame 320. The fourth horizontal frame 340 may be parallel to the third horizontal frame 330 and may be disposed below the third horizontal frame 330.

The first vertical frame 350 may be disposed on the left sides of the first to fourth horizontal frames 310, 320, 330 and 340, and the second vertical frame 360 may be disposed on the right sides of the first to fourth horizontal frames 310, 320, 330 and 340. The third vertical frame 370 and/or the fourth vertical frame 380 may connect the first horizontal frame 310 and the second horizontal frame 320.

A bar 390 may extend from the first vertical frame 350 to the second vertical frame 360, and move on front surfaces of the first vertical frame 350 and the second vertical frame 360 in the up-down direction.

A bottom frame 345 may form a lower surface of the display device. The frames 300 may be coupled on the bottom frame 345.

Referring to FIGS. 6 and 11, a motor 412 may be installed on the second vertical frame 360. The motor 412 may provide a rotational force. A gearbox 414 may transfer the rotational force provided by the motor 412. One side of a joint 416 may be connected to the gearbox 414. The rotational force provided by the motor 412 may adjust a gear reduction ratio through the gearbox 414 and may be transferred to the joint 416.

A pulley 402 may be adjacent to the motor 412 and rotatably mounted on the second vertical frame 360. The pulley 402 may be referred to as a lower pulley 402. A pulley 408 may be spaced from the lower pulley 402 and installed on the second vertical frame 360. The pulley 408 may be referred to as a middle pulley 408. The joint 416 may be connected to the pulley 402 to provide the rotational force to the pulley 402. A plurality of tension rollers 406 may be installed along a longitudinal direction of the second vertical frame 360.

A slider 405 may be fixed on a belt 420. The slider 405 may move between an upper end and a lower end of the second vertical frame 360 in response to the movement of the belt 420. A sensor 407 may be adjacent to the lower pulley 402 and mounted on the second vertical frame 360. The sensor 407 may detect the movement of the slider 402. Hence, the sensor 407 may detect the movement of the front cover 200 (see FIGS. 1 to 3) according to the rotation of the belt 420.

The front cover 200 may be rolled around a roller 430.

The same configuration and description may be applied to the first vertical frame 350.

Referring to FIGS. 7 and 11, a pulley 401 may be adjacent to the upper end of the second vertical frame 360 and rotatably mounted on the second vertical frame 360. The pulley 401 may be referred to as an upper pulley 401. The plurality of tension rollers 406 may be installed along the longitudinal direction of the second vertical frame 360. The bar 390 may move on the second vertical frame 360. A guide roller 404 may be installed at one end and/or both ends of the bar 390. The guide roller 404 together with the bar 390 may move on the second vertical frame 360. The front cover 200 (see FIGS. 1 to 3) may be fixed to the bar 390. The same configuration and description may be applied to the first vertical frame 350.

Referring to FIGS. 6, 7 and 11, the belt 420 may be caught on the upper pulley 401, the middle pulley 408, and/or the lower pulley 402. For example, the belt 420 may be a timing belt. The belt 420 may be caught on the tension rollers 406 while being caught on the pulleys 401, 402 and 408, in order to maintain tension. Hence, the belt 420 can maintain a constant tension. The same configuration and description may be applied to the first vertical frame 350.

Referring to FIGS. 8 and 11, a rotator 440 may be disposed between the joint 416 and the pulley 402 and may rotate at the same time as the rotation of the joint 416 and/or the pulley 402. The rotator 440 may include a plurality of protrusions 443 along a circumference of the rotator 440. A sensor 444 may be adjacent to an outer surface of the rotator 440 and installed on the second vertical frame 360. The sensor 444 may detect the rotation of the rotator 440. The same configuration and description may be applied to the first vertical frame 350. Hence, the sync of the motors 412 installed on the left and right sides of the frame 300 (see FIG. 5) can be matched.

Referring to FIGS. 9 and 11, the motor 412 may be, for example, a step motor. An encoder 4121 may be installed on the motor 412. The encoder 4121 may adjust the rotation of the motor 412. The same configuration and description may be applied to the first vertical frame 350. Hence, the sync of the motors 412 installed on the left and right sides of the frame 300 (see FIG. 5) can be matched.

Referring to FIG. 10, the motor 412 may include gears 412G. The gears 412G may include a first gear 412a, a second gear 412b, a third gear 412c, and/or a fourth gear 412d. The first gear 412a may be connected or fixed to a rotating shaft of the motor 412.

For example, a gear ratio of the first gear 412a and the second gear 412b may be 2.08. For another example, a gear ratio of the second gear 412b and the third gear 412c may be 1.87. For another example, a gear ratio of the third gear 412c and the fourth gear 412d may be 1.87. A gear reduction ratio of the first to fourth gears 412a, 412b, 412c and 412d may be, for example, 7.2. The gear reduction ratio of the first to fourth gears 412a, 412b, 412c and 412d may be 6 to 8.

Referring to FIG. 12, a side cover 450 may cover an outer surface of the second vertical frame 360. The side cover 450 may include a first part 451, a second part 452, and a third part 453. The first part 451 may extend in the first direction DR1. The second part 452 may extend in the third direction DR3 and may be connected to the first part 451. The third part 453 may extend in the first direction DR1 and may be connected to the second part 452.

The first part 451 may cover a portion of a front surface of the bar 390. The second part 452 may cover the outer surface of the second vertical frame 360. The third part 453 may be disposed behind the second vertical frame 360.

The side cover 450 may include guide ribs 454 and 455. The guide ribs 454 and 455 may be adjacent to the guide roller 404 and may protrude to the inside of the first part 451 and/or the second part 452. Hence, the side cover 450 can guide the movement of the bar 390 and the front cover 200.

The same configuration and description may be applied to the first vertical frame 350.

Referring to FIG. 13, a front cover 20 may be coupled to a bar 950. The bar 950 may extend along the x-axis direction. The bar 950 may be referred to as a top bar 950.

A right assembly RA may include a mount 920, a motor 800, a gear, a gas spring 850, or a link 912RL. The link 912RL may include a lower link 912, an upper link 911, or a joint 913. The link 912RL may be referred to as a foldable link 912RL, a lift 912RL, a lift assembly 912RL, a foldable lift 912RL, or a foldable lift assembly 912RL.

A left assembly LA may include the same components as the right assembly RA. The left assembly LA and the right assembly RA may be symmetrical. The left assembly LA may include a mount 920L, a motor 800L, a gear, a gas spring 850L, or a link 912LL. The link 912LL may include a lower link 912L, an upper link 911L, or a joint 913L. The link 912LL may be referred to as a foldable link 912LL, a lift 912LL, a lift assembly 912LL, a foldable lift 912LL, or a foldable lift assembly 912LL. The links 912RL and 912LL may be folded or unfolded.

The mounts 920 and 920L may be installed on an upper surface of a base 32. The base 32 may be referred to as a bottom frame 32. The motors 800 and 800L may be installed on the mounts 920 and 920L. Lower parts of the lower links 912 and 912L may be pivotably installed on the mounts 920 and 920L. Upper parts of the lower links 912 and 912L may be pivotably connected to the joints 913 and 913L. Lower parts of the upper links 911 and 911L may be pivotably connected to the joints 913 and 913L. Upper parts of the upper links 911 and 911L may be pivotally connected to the bar 950.

The gear may be fixed or fastened to the lower parts of the lower links 912 and 912L. The motors 850 and 850L may transfer power to gears of the lower links 912 and 912L through the gearbox. The lower links 912 and 912L may be pivoted by the motors 850 and 850L.

The gas springs 850 and 850L may include a cylinder and a piston. The piston may linearly reciprocate along the cylinder. The piston may enter the inside of the cylinder or come out of the cylinder. The cylinder may contain a gas therein. The gas may be sealed by the cylinder and the piston. When the piston enters the inside of the cylinder, the gas may be compressed. When the gas is compressed, the gas may provide a restoring force to the piston. The restoring force may be a force that allows the gas to expand. When the gas is compressed, the gas may push the piston. The gas springs 850 and 850L may be replaced by an oil hydraulic cylinder, a pneumatic cylinder (or an air cylinder), or an actuator.

A first base 31 may have a plate shape. The first base 31 may face a second base 32. The first base 31 may be disposed under the second base 32. A supporter 35 may be disposed between the first base 31 and the second base 32. The supporter 35 may be fastened to the first base 31 by a fastening member. The supporter 35 may be fastened to the second base 32 by a fastening member.

A roller 143 may be installed on the first base 31. The roller 143 may be disposed between the first base 31 and the second base 32. A part of the front cover 20 may be rolled around the roller 143, and a part of the front cover 20 may be unrolled from the roller 143. The front cover 20 unrolled from the roller 143 may extend upward. The roller 143 may be installed on the mount 36. The mount 36 may be installed between the first base 31 and the second base 32. The roller 143 may be rotatably installed on the mount 36.

A y-axis direction height of the bar 950 may be the maximum. When the y-axis direction height of the bar 950 is the maximum, an angle E between the lower links 912 and 912L and the upper links 911 and 911L may be the maximum. For example, the angle E may be 180 degrees. When the y-axis direction height of the bar 950 is the maximum, lengths of the gas springs 850 and 850L may be the maximum. When the y-axis direction height of the bar 950 is the maximum, the front cover 20 may be unrolled from the roller 143 to the maximum.

Referring to FIG. 14, the motors 800 and 800L may rotate or pivot the lower links 912 and 912L. As the motors 800 and 800L rotate or pivot the lower links 912 and 912L in a direction of raising the lower links 912 and 912L with respect to the base 32, an angle D between the lower links 912 and 912L and the upper links 911 and 911L may increase. As the motors 800 and 800L rotate or pivot the lower links 912 and 912L in the direction of raising the lower links 912 and 912L with respect to the base 32, an angle between the lower links 912 and 912L and the base 32 may also increase.

As the motors 800 and 800L rotate or pivot the lower links 912 and 912L in the direction of raising the lower links 912 and 912L with respect to the base 32, the bar 950 may move in the +y-axis direction. As the motors 800 and 800L rotate or pivot the lower links 912 and 912L in the direction of raising the lower links 912 and 912L with respect to the base 32, the front cover 20 may be unrolled from the roller 143. As the motors 800 and 800L rotate or pivot the lower links 912 and 912L in the direction of raising the lower links 912 and 912L with respect to the base 32, lengths of the gas springs 850 and 850L may be extended. The gas springs 850 and 850L may provide a restoring force to the lower links 912 and 912L in the direction of raising the lower links 912 and 912L with respect to the base 32.

As the motors 800 and 800L rotate or pivot the lower links 912 and 912L in the opposite direction of the direction of raising the lower links 912 and 912L with respect to the base 32, the angle D between the lower links 912 and 912L and the upper links 911 and 911L may decrease. As the motors 800 and 800L rotate or pivot the lower links 912 and 912L in the opposite direction of the direction of raising the lower links 912 and 912L with respect to the base 32, the angle between the lower links 912 and 912L and the base 32 may increase.

As the motors 800 and 800L rotate or pivot the lower links 912 and 912L in the opposite direction of the direction of raising the lower links 912 and 912L with respect to the base 32, the bar 950 may move in the -y-axis direction. As the motors 800 and 800L rotate or pivot the lower links 912 and 912L in the opposite direction of the direction of raising the lower links 912 and 912L with respect to the base 32, the front cover 20 may be rolled around the roller 143.

As the motors 800 and 800L rotate or pivot the lower links 912 and 912L in the opposite direction of the direction of raising the lower links 912 and 912L with respect to the base 32, the lengths of the gas springs 850 and 850L may decrease. The gas springs 850 and 850L may provide a restoring force to the lower links 912 and 912L in the direction of raising the lower links 912 and 912L with respect to the base 32.

As the lower links 912 and 912L rotate or pivot in the direction of raising the lower links 912 and 912L, a distance between the joints 913 and 913L may increase. As the lower links 912 and 912L rotate or pivot in the opposite direction of the direction of raising the lower links 912 and 912L, the distance between the joints 913 and 913L may decrease.

Certain embodiments or other embodiments of the present disclosure described above are not mutually exclusive or distinct from each other. Some embodiments or other embodiments of the present disclosure described above may be combined with each other in configuration or function.

For example, configuration "A" described in one embodiment and/or the drawings and configuration "B" described in another embodiment and/or the drawings may be combined with each other. That is, although the combination between the configurations is not directly described, the combination is possible except in the case where it is described that the combination is impossible.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A display device comprising:
a display panel;
a module cover disposed behind the display panel and coupled to the display panel;
a frame disposed behind the module cover and coupled to the module cover, wherein the frame includes a plurality of horizontal frames extending in the left-right direction of the display panel, and a vertical frame intersecting and coupled to the plurality of horizontal frames, the vertical frame being disposed adjacent to one side of the display panel;
a front cover configured to close or open the display panel while moving on the frame in an up-down direction;
a bar extending in a left-right direction of the display panel and sliding on the frame, wherein an upper end of the front cover is fixed to the bar;
a roller disposed adjacent to a lower end of the frame and configured to roll or unroll the front cover;
a guide roller sliding and moving on the vertical frame, the guide roller being fixed to the bar;
a lower pulley installed at the vertical frame adjacent to the roller;
an upper pulley installed adjacent to an upper end of the vertical frame; and
a belt configured to connect the lower pulley and the upper pulley, wherein the guide roller is fixed to the belt.

2. The display device of claim 1, further comprising:
a tension roller installed at the vertical frame between the upper pulley and the lower pulley,
wherein the tension roller is configured to pull or push the belt.

3. The display device of claim 1, further comprising:
a motor mounted on the vertical frame and configured to provide a rotational force to the lower pulley.

4. The display device of claim 3, further comprising:
a joint disposed between the motor and the lower pulley,
wherein the joint is configured to transfer the rotational force provided by the motor to the lower pulley.

5. The display device of claim 4, wherein the motor includes:
a first gear fixed to a rotating shaft of the motor;
a second gear engaged with the first gear;
a third gear engaged with the second gear; and
a fourth gear engaged with the third gear,
wherein a gear reduction ratio of the first to fourth gears is 6 to 8.

6. The display device of claim 3, further comprising:
a rotator disposed between the motor and the lower pulley and including a plurality of protrusions, the rotator configured to rotate together with the lower pulley; and
a sensor disposed adjacent to the plurality of protrusions of the rotator and configured to detect a rotation of the rotator.

7. The display device of claim 3, wherein the motor further includes an encoder configured to detect a rotation of the rotator.

8. The display device of claim 1, further comprising:
a side cover disposed adjacent to the vertical frame,
wherein the side cover includes;
a first part covering a portion of the bar;
a second part bending and extending from the first part and covering the belt;
a third part bending and extending from the second part, the third part being opposite to the first part with respect to the vertical frame; and
guide ribs protruding from the first part or the second part toward a side frame and configured to guide the guide roller.

9. The display device of claim 1, further comprising:
a foldable link connected to the bar and configured to move the bar in the up-down direction.

10. The display device of claim 9, wherein the foldable link includes:
an upper link pivotally connected to the bar;
a lower link pivotally connected to the upper link; and
a motor configured to raise the lower link.

11. The display device of claim 10, further comprising:
a gas spring connected to the lower link and configured to push the lower link.

12. The display device of claim 9, wherein the foldable link includes a plurality of foldable links,
wherein the plurality of foldable links are disposed on left and right sides of the front cover, respectively.

\* \* \* \* \*